United States Patent
Keil et al.

(10) Patent No.: US 6,630,407 B2
(45) Date of Patent: Oct. 7, 2003

(54) PLASMA ETCHING OF ORGANIC ANTIREFLECTIVE COATING

(75) Inventors: Douglas Keil, Fremont, CA (US); Jim Bowers, Brookfield, CT (US); Eric Wagganer, Milpitas, CA (US); Rao Annapragada, Union City, CA (US); Tri Le, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/820,689

(22) Filed: Mar. 30, 2001

(65) Prior Publication Data
US 2002/0173160 A1 Nov. 21, 2002

(51) Int. Cl.$^7$ ............................................. H01L 21/302
(52) U.S. Cl. ...................................... 438/717; 216/47
(58) Field of Search ....................... 438/717, 738, 438/585, 671, 675, 9, 689, 723; 430/316, 318; 216/47, 49–50, 67

(56) References Cited

U.S. PATENT DOCUMENTS

| | | |
|---|---|---|
| 5,013,398 A | 5/1991 | Long et al. |
| 5,013,400 A | 5/1991 | Kurasaki et al. |
| 5,021,121 A | 6/1991 | Groechel et al. |
| 5,022,958 A | 6/1991 | Favreau et al. |
| 5,269,879 A | 12/1993 | Rhoades et al. |
| 5,468,339 A * | 11/1995 | Gupta et al. .................. 216/67 |
| 5,494,854 A | 2/1996 | Jain |
| 5,529,657 A | 6/1996 | Ishii |
| 5,595,627 A | 1/1997 | Inazawa et al. |
| 5,611,888 A | 3/1997 | Bosch et al. |
| 5,721,090 A | 2/1998 | Okamoto et al. |
| 5,773,199 A | 6/1998 | Linliu et al. |
| 5,780,338 A | 7/1998 | Jeng et al. |
| 5,820,261 A | 10/1998 | Yam |
| 5,854,126 A | 12/1998 | Tobben et al. |
| 5,910,453 A * | 6/1999 | Gupta et al. ................. 438/717 |
| 6,013,582 A * | 1/2000 | Ionov et al. ................. 438/738 |
| 6,039,888 A | 3/2000 | Ha et al. |
| 6,040,248 A | 3/2000 | Chen et al. |
| 6,080,529 A | 6/2000 | Ye et al. |
| 6,080,678 A | 6/2000 | Yim |
| 6,090,304 A | 7/2000 | Zhu et al. |
| 6,090,722 A | 7/2000 | Armacost et al. |
| 6,159,862 A | 12/2000 | Yamada et al. |
| 6,232,209 B1 * | 5/2001 | Fujiwara et al. ............ 438/585 |
| 6,235,633 B1 * | 5/2001 | Jang .......................... 438/675 |
| 6,268,287 B1 * | 7/2001 | Young et al. ............... 438/671 |
| 6,284,149 B1 * | 9/2001 | Li et al. ....................... 216/64 |
| 6,296,780 B1 * | 10/2001 | Yan et al. ..................... 216/67 |
| 6,326,307 B1 * | 12/2001 | Lindley et al. ............. 438/689 |
| 6,331,380 B1 * | 12/2001 | Ye et al. ..................... 430/318 |
| 6,340,603 B1 * | 1/2002 | Bell .............................. 438/9 |
| 6,379,872 B1 * | 4/2002 | Hineman et al. ........... 430/316 |
| 6,380,096 B2 * | 4/2002 | Hung et al. ................. 438/723 |

* cited by examiner

Primary Examiner—David Nelms
Assistant Examiner—David Vu
(74) Attorney, Agent, or Firm—Burns, Doane, Swecker & Mathis, LLP (57) ABSTRACT

A semiconductor manufacturing process wherein an organic anti-reflective coating (ARC) is plasma etched with selectivity to an underlying dielectric layer and/or overlying photoresist. The etchant gas is fluorine-free and includes a carbon-containing gas such as CO gas, a nitrogen-containing gas such as $N_2$, an optional oxygen-containing gas such as $O_2$, and an optional inert carrier gas such as Ar. The etch rate of the ARC can be at least 10 times higher than that of the underlying layer. Using a combination of CO and $O_2$ with $N_2$ and a carrier gas such as Ar, it is possible to obtain dielectric:ARC selectivity of at least 10. The process is useful for etching contact or via openings in damascene and self-aligned contact or trench structures.

20 Claims, 7 Drawing Sheets

FIG. 2A — Pre-etch Condition
FIG. 2B — Post-etch Condition

FIG. 2C — Re-patterned for Via
FIG. 2D — Post-etch Condition

*Pre-etch Condition*

FIG. 3A

*Post-etch Condition*

PLASMA ETCHING OF ORGANIC ANTIREFLECTIVE COATING

FIELD OF THE INVENTION

The present invention relates to an improved method for plasma etching anti-reflective coatings in the fabrication of integrated circuits.

BACKGROUND OF THE INVENTION

A common requirement in integrated circuit fabrication is the etching of openings such as contacts, vias and trenches in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal suicides such as titanium silicide, cobalt silicide, tungsten silicide, molybdenum silicide, etc.

Various plasma etching techniques for etching openings in silicon oxide are disclosed in U.S. Pat. Nos. 5,013,398; 5,013,400; 5,021,121; 5,022,958; 5,269,879; 5,529,657; 5,595,627; 5,611,888; and 5,780,338. The plasma etching can be carried out in medium density reactors such as the parallel plate plasma reactor chambers described in the '398 patent or the triode type reactors described in the '400 patent or in high density reactors such as the inductive coupled reactors described in the '657 patent. U.S. Pat. No. 6,090,304 discloses a method of plasma etching semiconductor substrates in a dual frequency plasma reactor wherein a first radiofrequency (RF) source is coupled to a top showerhead electrode through an RF matching network and a bottom electrode (on which a semiconductor wafer is supported) is coupled to a second RF source through a second matching network.

In processing semiconductor wafers, it is conventional to provide an organic bottom antireflective coating (ARC) beneath a photoresist for purposes of minimizing optical reflection of the radiation used to develop a pattern of openings (such as contact holes) in the photoresist. It is also conventional to plasma etch the ARC through the openings formed in the resist in order to transfer the photoresist pattern to the ARC. Etch gas mixtures for plasma etching organic ARC materials are disclosed in U.S. Pat. Nos. 5,721,090; 5,773,199; 5,910,453; 6,039,888; 6,080,678; and 6,090,722. Of these, the '090 patent discloses a gas mixture of $C_4F_8$, $O_2$ and $N_2$, the '199 patent discloses a gas mixture of $CHF_3+CF_4+O_2+Ar$; the '453 patent discloses gas mixtures of $N_2+He+O_2$ or $N_2+O_2$ or $N_2+He$; the '888 patent discloses a gas mixture of $O_2+CO$; the '678 patent discloses a gas mixture of $O_2+SO_2$; and the '722 patent discloses a gas mixture of $C_2F_6+Ar$.

As device geometries become smaller and smaller, the need for high etch selectivity ratios is even greater in order to achieve plasma etching openings through ARC layers while preserving critical dimensions (CD). Selectivity is also desirable when etching organic ARC layers having areas of different thicknesses since the underlying material will be exposed to the etching gas for longer times in the areas which underlie the thinner portions of the ARC.

Accordingly, there is a need in the art for a plasma etching technique which provides high etch selectivity ratios and/or which etches such layers at a desirable rate.

SUMMARY OF THE INVENTION

The invention provides a method of etching an organic anti-reflective coating (ARC) with selectivity to an overlying photoresist and/or underlying dielectric layer, comprising supporting a semiconductor substrate in a plasma etch reactor, the substrate including an organic anti-reflective coating (ARC) between an underlying dielectric layer and an overlying photoresist layer, and energizing a fluorine-free etchant gas into a plasma state and etching openings in the ARC, the etchant gas comprising a carbon-containing gas and a nitrogen-containing gas. In a preferred embodiment, the etching gas further includes $O_2$ and/or an inert gas such as Ar.

According to a preferred embodiment, the openings comprise vias, contacts, and/or trenches of a dual damascene or self-aligned structure and/or the ARC is a polymer film. The plasma etch reactor can comprise an ECR plasma reactor, an inductively coupled plasma reactor, a capacitively coupled plasma reactor, a helicon plasma reactor or a magnetron plasma reactor. A preferred plasma etch reactor is a dual frequency capacitively coupled plasma reactor including an upper showerhead electrode and a bottom electrode, RF energy being supplied at two different frequencies to either the bottom electrode or at different first and second frequencies to the showerhead electrode and the bottom electrode.

During the etching step, pressure in the plasma etch reactor can be up to 200 mTorr and/or temperature of the substrate support can be $-20°$ C. to $+200°$ C., preferably $+20°$ C. to $+50°$ C. The etching gas can include CO as the carbon-containing gas supplied to the plasma etch reactor at a flow rate of 1 to 500 sccm, $O_2$ supplied to the plasma etch reactor at a flow rate of 1 to 50 sccm, and the nitrogen-containing gas can include $N_2$ supplied to the plasma etch reactor at a flow rate of 0 to 250 sccm. The etch gas can optionally include Ar as the inert gas supplied to the plasma etch reactor at a flow rate of 0 to 500 sccm. As an example, the etching gas can include 50 to 500 sccm CO, 2 to 10 sccm $O_2$, 50 to 150 sccm $N_2$, and 100 to 300 sccm Ar.

The etching step can be followed by additional etching steps and subsequent filling of the openings with metal. The method of the invention can also include steps of forming the photoresist layer on the substrate, patterning the photoresist layer to form a plurality of openings followed by etching a metallization pattern of conductor lines, via or contact openings in the organic anti-reflective coating.

DETAILED DESCRIPTION OF THE INVENTION

The invention provides a semiconductor manufacturing process wherein openings can be plasma etched in a thin organic anti-reflective coating (ARC) while providing desired selectivity to an overlying photoresist and/or an underlying dielectric layer such as silicon oxide. The ARC is used to reduce reflection back into the photoresist during its exposure in a lithography step and allows better pattern reproduction such as a pattern of openings in the form of vias or trenches formed in the photoresist. The ARC can be any suitable material such as a hydrocarbon film, e.g., a spin-on organic material comprising an organic polymeric compound. The ARC can be spun on the substrate to have a desired thickness, e.g., 600 to 2000 Å.

The invention overcomes a problem associated with etching an ARC layer with oxygen. During plasma etching with oxygen, the molecular oxygen dissociates into oxygen atoms which etch the overlying and underlying layers and cause the critical dimension (CD) to change. CD loss is undesirable when etching features having small line widths. Such CD loss can be caused when the ARC has different thicknesses and the ARC etch breaks through to the underlying dielectric layer at different times. According to the invention, better selectivity between the ARC and an underlying dielectric layer such as silicon oxide can be obtained by using a carbon-containing etch gas. With the improved selectivity to the underlying layer, the problem of early break through at thinner portions of the ARC and consequent CD loss can be overcome.

The invention overcomes a problem associated with etching an ARC layer with fluorine. The use of fluorocarbon gases to generate a protective polymer on sidewalls of the openings in the photoresist and the etched openings of the ARC can cause profile and uniformity issues due to attack of the underlying layer by the fluorine atoms present in the plasma. In accordance with the invention, such problems can be avoided by using a fluorine-free carbon-containing etching gas.

According to a preferred embodiment, the etching gas includes CO, an optional oxygen-containing gas, an inert gas and an optional nitrogen-containing gas. The process of the invention is carried out by energizing the etchant gas into a plasma state and etching openings in the ARC. To minimize CD loss during etching of the ARC, it is desirable to etch the ARC while preserving the photoresist and minimizing attack of the underlying dielectric layer. Whereas fluorine containing and $O_2$ etchant gases can lead to CD, profile, and uniformity problems, CO offers several advantages as an etchant gas. For example, the CO dissociates into C and O in the plasma with the O etching the ARC and carbon coating the sidewalls of the etched openings and overlying photoresist with a protective film. When an inert gas such as Ar and a nitrogen-containing gas such as $N_2$ are included in the etching gas, the Ar can be used to help strike the plasma and the $N_2$ can aid in etching the ARC and/or scavenge excess atomic oxygen.

The carbon-containing etch process preserves lateral CD. Improvement in uniformity and profile can be achieved because the ARC etch is an ion assisted etch which has selectivity to the underlying dielectric layer. The selectivity can be obtained because CO is absorbed on the surface of the ARC being etched and oxygen is released from the CO by impinging ions. The released oxygen attacks the carbon and hydrogen components of the ARC and when the underlying dielectric layer is reached, the dielectric layer is etched at a slower rate than in the case where fluorine containing etchant gases are used.

Tests were carried out in an Exelan™ dual frequency capacitively coupled oxide etch system available from Lam Research Corporation, the assignee of the present application. Table 1 sets forth photoresist etch rates (ER in Å/minute) using a Exelan™ multi-frequency oxide etch system wherein the chamber pressure (mTorr) and the CO flow rate (sccm), $O_2$ flow rate (sccm), $N_2$ flow rate (sccm), and Ar flow rate (sccm) were as indicated in Table 2. Because the ARC is thin (less than 50 nm), carrier gases such as Ar can be added in amounts effective to provide a desired etch rate of the ARC in angstroms per minute. The top power (watts) and bottom power (watts) were 400 W and 300 W, respectively.

TABLE 1

| Run Number | $O_2$ Flow (sccm) | CO Flow (sccm) | $N_2$ Flow (sccm) | Ar Flow (sccm) | Photoresist Etch Rate (Å/min) | Pressure (mT) |
|---|---|---|---|---|---|---|
| 1 | 4 | 100 | 50 | 125 | 1168 | 95 |
| 2 | 4 | 100 | 50 | 250 | 1185 | 133 |
| 3 | 4 | 200 | 50 | 125 | 930 | 121 |
| 4 | 4 | 200 | 50 | 250 | 970 | 157 |
| 5 | 4 | 100 | 145 | 125 | 1282 | 119 |
| 6 | 4 | 100 | 145 | 250 | 1280 | 155 |
| 7 | 4 | 200 | 145 | 125 | 987 | 145 |
| 8 | 4 | 200 | 145 | 250 | 1371 | 178 |
| 9 | 6 | 100 | 50 | 125 | 1991 | 97 |
| 10 | 6 | 100 | 50 | 250 | 1976 | 134 |
| 11 | 6 | 200 | 50 | 125 | 1697 | 123 |
| 12 | 6 | 200 | 50 | 250 | 1691 | 158 |
| 13 | 6 | 100 | 145 | 125 | 2245 | 121 |
| 14 | 6 | 100 | 145 | 250 | 2136 | 157 |
| 15 | 6 | 200 | 145 | 125 | 1831 | 145 |
| 16 | 6 | 200 | 145 | 250 | 1843 | 179 |
| 17 | 5 | 150 | 97.5 | 187.5 | 1354 | 140 |
| 18 | 5 | 150 | 97.5 | 187.5 | 1103 | 140 |

In etching features in an integrated circuit, the ARC can overlay a dielectric layer such as silicon nitride, doped silicon oxide such as fluorinated silicon oxide (FSG), undoped silicon oxide such as silicon dioxide, spin-on-glass (SOG), silicate glasses such as boron phosphate glass (BPSG) and phosphate silicate glass (PSG), doped or undoped thermally grown silicon oxide, doped or undoped TEOS, deposited silicon oxide, and inorganic low-k dielectric materials. Such layers can form part of a damascene structure. During manufacture of such structures, features such as contacts, vias, conductor lines, etc. are etched in dielectric materials such as oxide layers in the manufacture of integrated circuits. The invention overcomes a problem with prior etching techniques wherein the ARC etch led to CD loss, lack of uniformity, and loss of profile during etching of the dielectric layers after the ARC etch.

The ARC and dielectric layers can also be provided on a semiconductor substrate wherein the Arc and/or the dielectric layer is over a conductive or semiconductive layer. For instance, the ARC or dielectric layer can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc.

According to one aspect of the invention, the ARC etch can be incorporated in a single or dual-damascene etch process wherein the ARC overlies a silicon oxide layer and the ARC etch is highly selective to the silicon oxide layer. Preferably, the silicon oxide etch rate is substantially less than that of the ARC, e.g., the oxide etch rate can be less than 100 Å/minute, less than 50 Å/minute, or substantially zero while the ARC etch rate is greater than 1000 Å/minute, preferably greater than 1600 Å/minute and most preferably greater than 2200 Å/minute, thus obtaining high selectivity to oxide during an ARC etch. In an exemplary embodiment, the process achieves high selectivity in the trench etch step of a dual damascene structure. Additionally, the ARC etch preferably minimizes faceting and controls lateral spreading. According to an additional aspect of the invention, the ARC etch can be incorporated into a SAC etch process wherein an ARC etch is as highly selective to oxide as indicated above in connection with the damascene etch process. The ARC etch process can provide a low or reversed RIE lag, which can allow multi-level dielectric etch applications and enable the fabrication of dual-damascene and SAC structures.

Figure 1A:
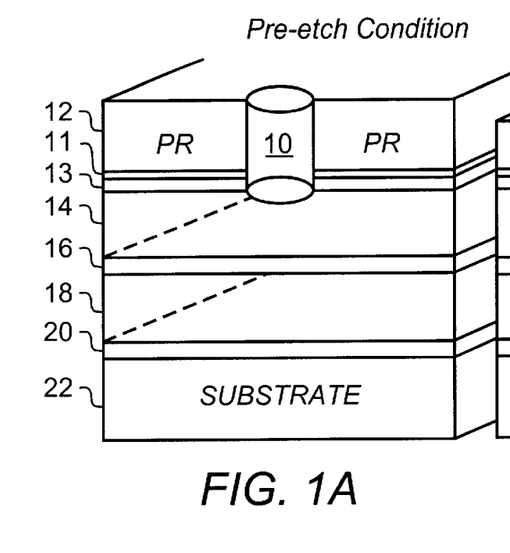
FIGS. 1A–D show schematic representations of a via-first dual-damascene structure which includes an ARC etched according to the process of the invention, FIG. 1A showing a pre-etch condition, FIG. 1B showing a post-etch condition in which a via has been etched, FIG. 1C showing the structure re-patterned for a trench etch and FIG. 1D showing a post-etch condition in which the trench has been etched.
Figure 1B:
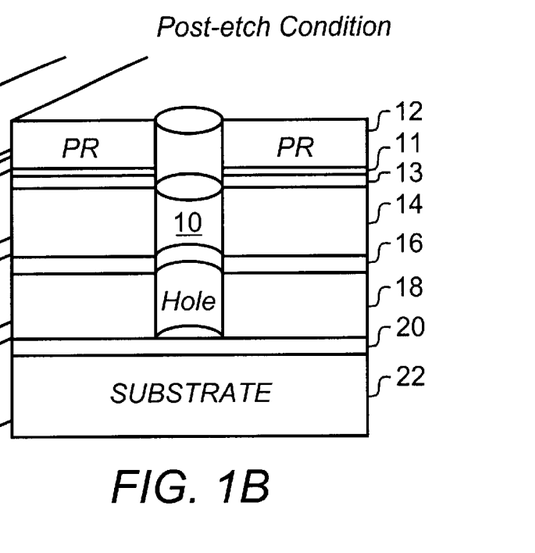
Figure 1C:
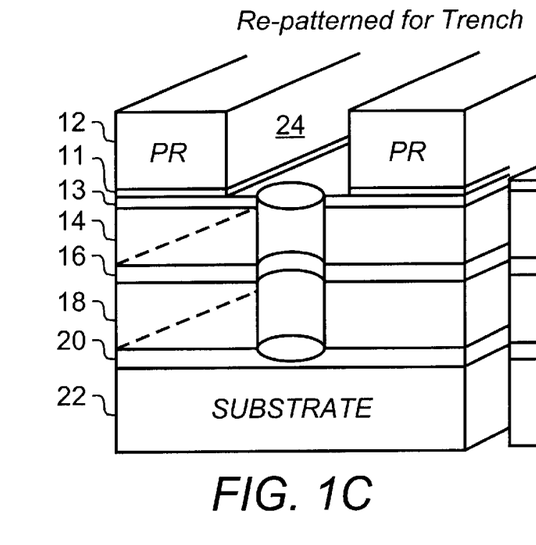
Figure 1D:
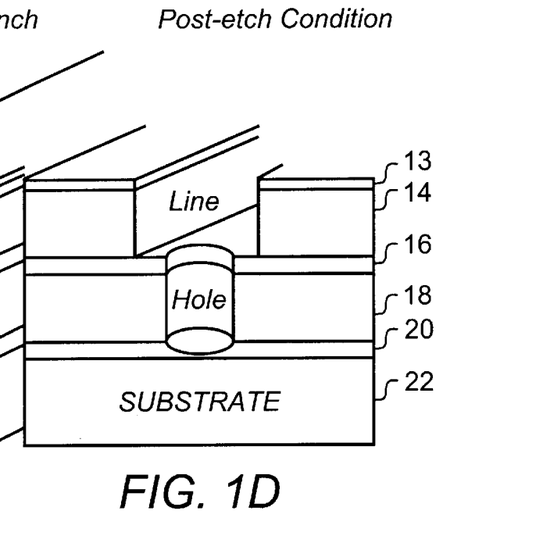

FIGS. 1A–D show schematics of how a via-first dual-damascene structure incorporating an organic ARC can be etched in accordance with the invention. FIG. 1A shows a pre-etch condition wherein an opening 10 corresponding to a via is provided in a photoresist masking layer 12 which overlies a stack of an organic anti-reflective coating (ARC) layer 11, a hard mask 13 such as silicon nitride, a first dielectric layer 14 such as silicon oxide, a first stop layer 16 such as silicon nitride, a second dielectric layer 18 such as silicon oxide, a second stop layer 20 such as silicon nitride, and a substrate 22 such as a silicon wafer. FIG. 1B shows the structure after etching wherein the opening 10 extends through the ARC 11 and mask layer 13, dielectric layers 14,18 and first stop layer 16 to the second stop layer 20. FIG. 1C shows the structure after re-patterning the masking layer for a trench 24. FIG. 1D shows the structure after etching wherein the photoresist and ARC 11 have been removed, the trench being etched through the mask layer 13 and first dielectric layer 14 down to the first stop layer 16.

Figure 2A:
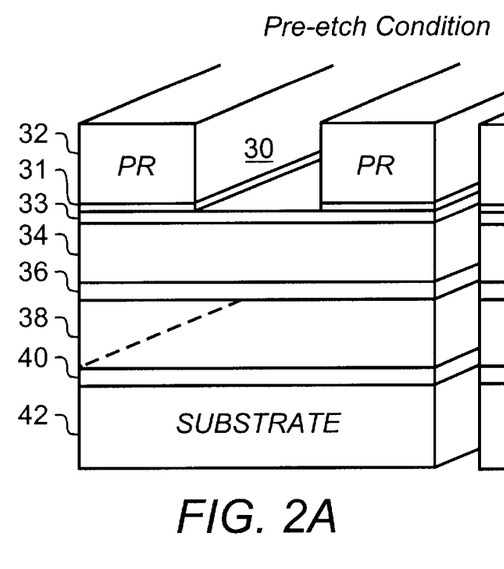
FIGS. 2A–D show schematic representations of a trench-first dual-damascene structure which includes an ARC etched according to the process of the invention, FIG. 2A showing a pre-etch condition, FIG. 2B showing a post-etch condition in which a trench has been etched, FIG. 2C showing the structure re-patterned for a via etch and FIG. 2D showing a post-etch condition in which the via has been etched.
Figure 2B:
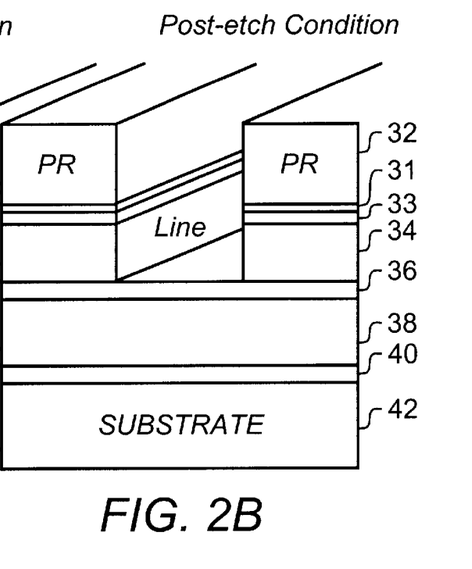
Figure 2C:
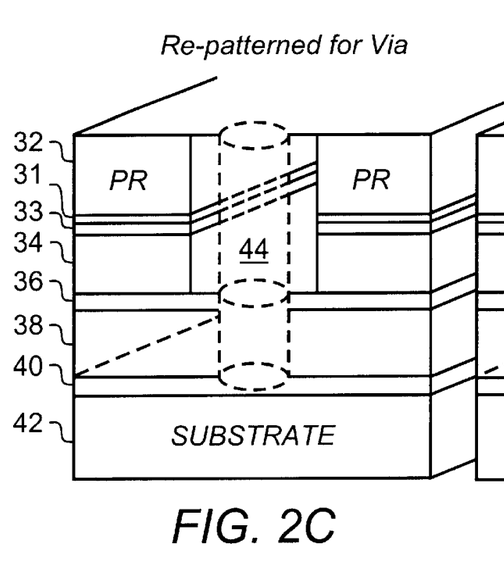
Figure 2D:
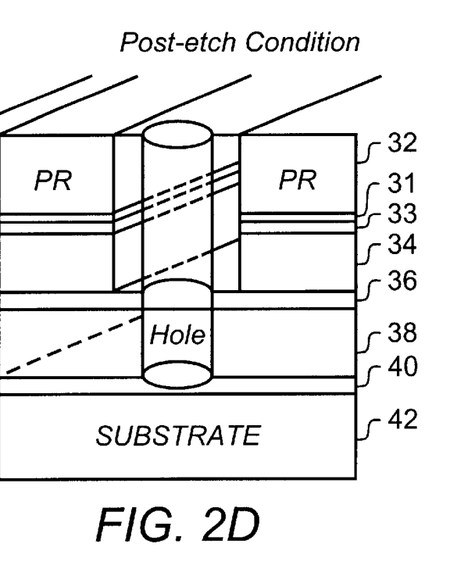

FIGS. 2A–D show schematics of how a trench-first dual-damascene structure can be etched in accordance with the invention. FIG. 2A shows a pre-etch condition wherein an opening 30 corresponding to a trench is provided in a photoresist masking layer 32 which overlies a stack of an organic anti-reflective coating (ARC) layer 31, a hard mask 33 such as silicon nitride, a first dielectric layer 34 such as silicon oxide, a first stop layer 36 such as silicon nitride, a second dielectric layer 38 such as silicon oxide, a second stop layer 40 such as silicon nitride, and a substrate 42 such as a silicon wafer. FIG. 2B shows the structure after etching wherein the opening 30 extends through the ARC 31, the hard mask 33 and the dielectric layer 34 to the first stop layer 36. FIG. 2C shows the structure after re-patterning the masking layer for a via 44. FIG. 2D shows the structure after etching wherein the second dielectric layer 38 is etched down to the second stop layer 40 in the shape of a hole.

Figure 3A:
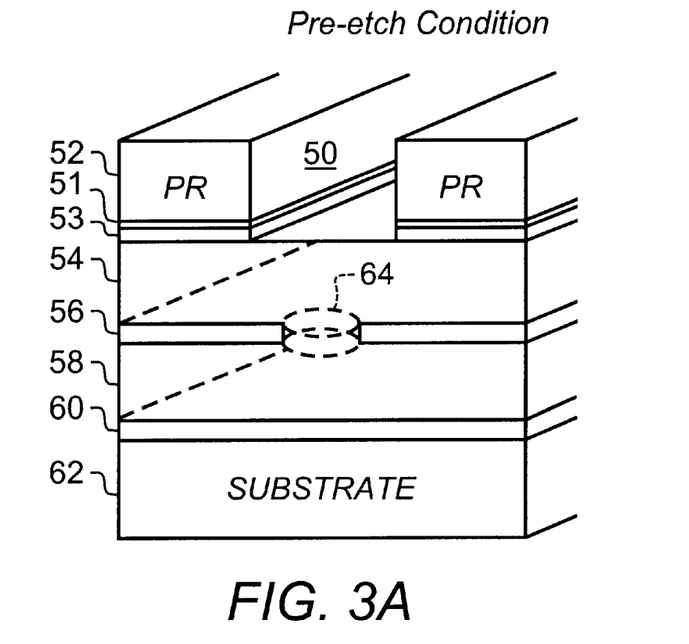
FIGS. 3A–B show schematic representations of a self-aligned dual-damascene structure which includes an ARC etched according to the process of the invention, FIG. 3A showing a pre-etch condition and FIG. 3B showing a post-etch condition in which a trench and a via have been etched.
Figure 3B:
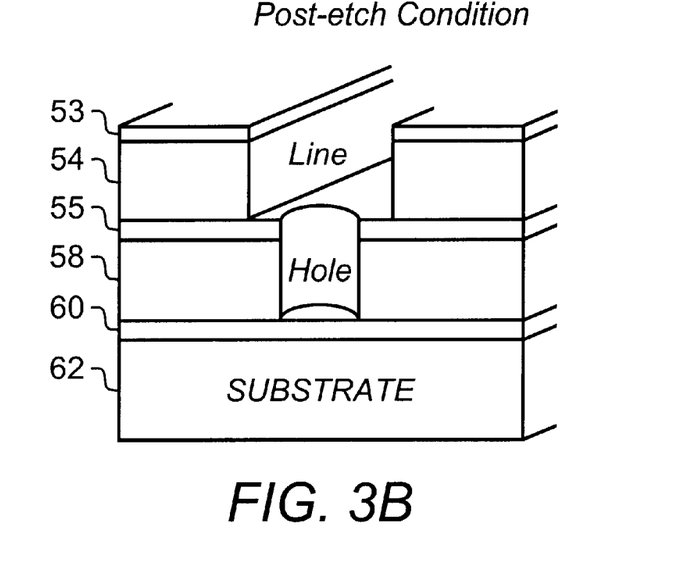

FIGS. 3A–B show schematics of how a dual-damascene structure can be etched in a single step in accordance with the invention. FIG. 3A shows a pre-etch condition wherein an opening 50 corresponding to a trench is provided in a photoresist masking layer 52 which overlies a stack of an organic anti-reflective coating (ARC) 51, a hard mask layer 53 such as silicon nitride, a first dielectric layer 54 such as silicon oxide, a first stop layer 56 such as silicon nitride, a second dielectric layer 58 such as silicon oxide, a second stop layer 60 such as silicon nitride, and a substrate 62 such as a silicon wafer. In order to obtain etching of vias through the first stop layer 56 in a single etching step, first stop layer 56 includes an opening 64. FIG. 3B shows the structure after etching wherein the photoresist and ARC have been removed and the opening 50 extends through the hard mask 53 and the dielectric layer 54 to the first stop layer 56 and the opening 64 extends through the second dielectric 58 to the second stop layer 60. Such an arrangement can be referred to as a "self-aligned dual-damascene" structure.

Figure 4A:
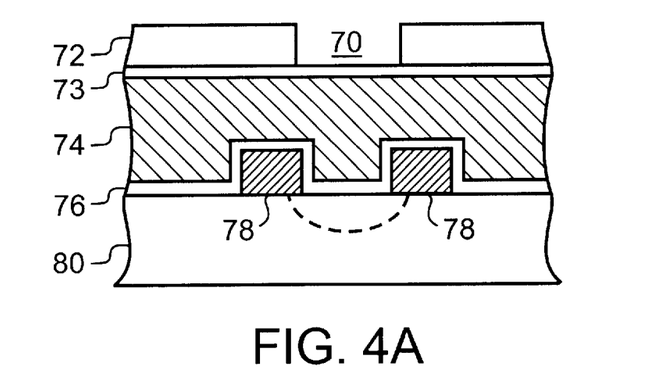
FIGS. 4A–C show schematic representations of a SAC structure which includes an ARC etched according to the process of the invention, FIG. 4A showing a pre-etch condition, FIG. 4B showing a post-etch condition in which an opening has been etched, and FIG. 4C showing a post-etch condition in which the nitride at the bottom of the opening has been removed.
Figure 4B:
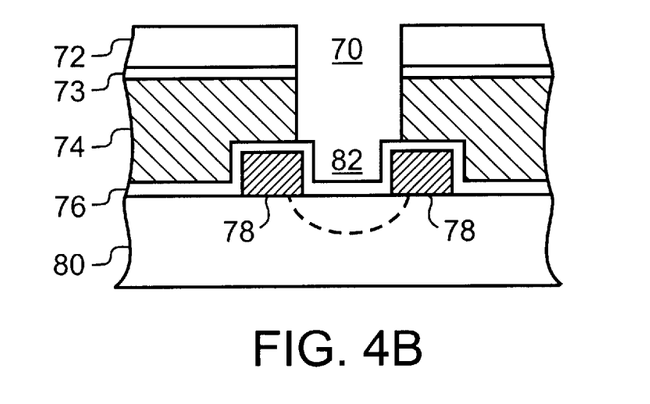
Figure 4C:
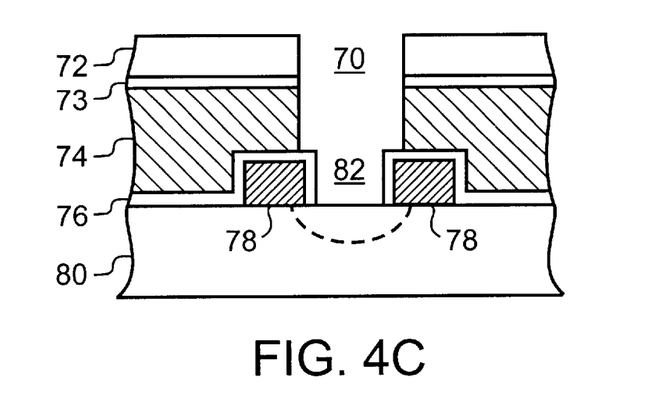

FIGS. 4A–C show schematics of how a SAC structure can be etched in accordance with the invention. FIG. 4A shows a pre-etch condition wherein an opening 70 is provided in a photoresist masking layer 72 which overlies a stack of an organic anti-reflective coating (ARC) layer 73, a first dielectric layer 74 such as silicon oxide, a stop layer 76 such as silicon nitride, gate structures 78, and a substrate 80 such as a silicon wafer. FIG. 4B shows the structure after etching wherein the opening 70 extends through the ARC layer 73 and the dielectric layer 74, to the stop layer 76. The opening 70 corresponds to the gap 82 between the gate structures 78. By the present invention, the ARC etch is highly selectivity to oxide. FIG. 4C shows the structure after removal of the stop layer 76 at the bottom of the opening 70.

The SAC structure and etching process offer the advantage that the contact hole 70 may be wider than the width of the gap 82 between the gate structures 78. Additionally, the photolithographic registry of the contact hole 70 with the gate structures 78 need not be precise. However, to achieve these beneficial effects, it is desirable during the ARC etch to provide an ARC etch rate which is much greater than the SAC oxide etch.

Figure 5:
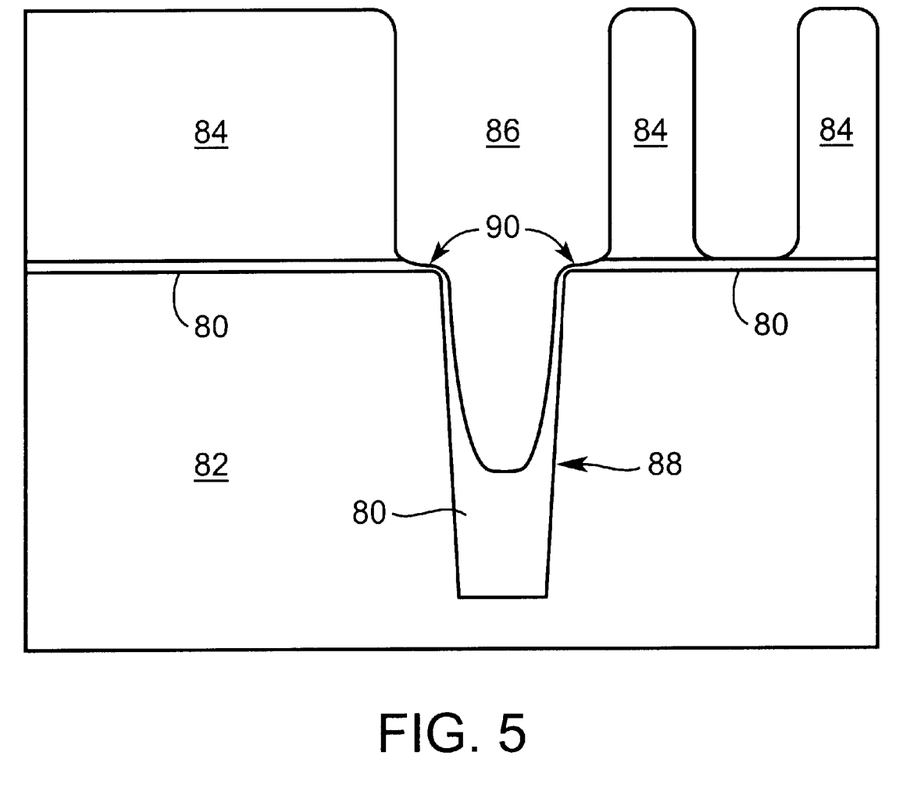
FIG. 5 shows an example of a structure etched in accordance with the invention wherein the ARC includes thin regions in areas where the ARC extends into vias of a via-first trench etch damascene structure.

FIG. 5 shows an example of a via-first trench damascene structure wherein an ARC layer 80 is provided on a dielectric layer 82 and a patterned photoresist 84 is provided over the ARC layer 80. The photoresist defines a trench 86 overlying a via 88 previously etched into the dielectric layer 82. As shown, areas of the ARC near the corners 90 of the via are thinner than portions of the ARC beneath the photoresist 84. The ARC layer 80 is typically spun on the previously etched dielectric layer and during the course of the spin-on procedure, capillary forces prevent achievement of a uniform thickness of the ARC layer near the openings of the vias 90. If the ARC was opened with an etching gas not selective to the dielectric layer, the top of the via would begin to facet and the bottom of the trench would not exhibit the desired flat bottom rectangular profile. For a given via hole size, the depth of ARC fill will depend on how much ARC is spun on the substrate. Further, the fill depth will also depend on the via hole size since capillary forces could cause smaller diameter vias to fill more filly than larger diameter vias. According to the invention, the highly selective ARC etch gas chemistry allows the ARC of the via-first trench structure shown in FIG. 5 to be etched while minimizing the danger of faceting the top of the vias and/or forming a non-flat trench bottom.

The plasma can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,261, the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

Figure 6:
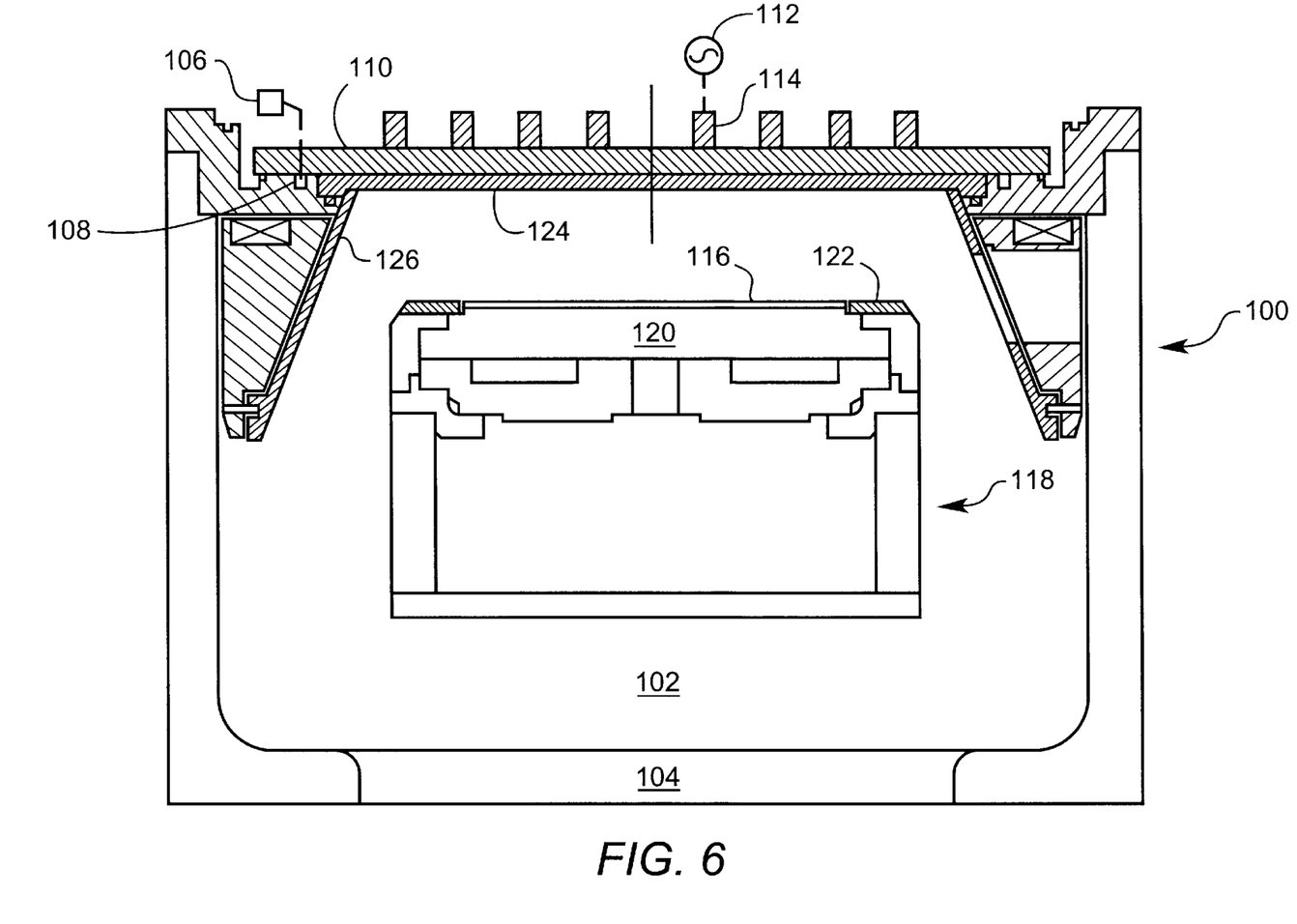
FIG. 6 shows a schematic representation of an inductively coupled high density plasma reactor which can be used to carry out the process of the invention.

The process of the invention can be carried out in an inductively coupled plasma reactor such as reactor 100 shown in FIG. 6. The reactor 100 includes an interior 102 maintained at a desired vacuum pressure by a vacuum pump connected to an outlet 104 in a lower wall of the reactor. Etching gas can be supplied to a showerhead arrangement be supplying gas from gas supply 106 to a plenum 108 extending around the underside of a dielectric window 110. A high density plasma can be generated in the reactor by supplying RF energy from an RF source 112 to an external RF antenna 114 such as a planar spiral coil having one or more turns outside the dielectric window 110 on top of the reactor. The plasma generating source can be part of a modular mounting arrangement removably mounted in a vacuum tight manner on the upper end of the reactor.

A semiconductor substrate 116 such as a wafer is supported within the reactor on a substrate support 118 such as a cantilever chuck arrangement removably supported by a modular mounting arrangement from a sidewall of the reactor. The substrate support 118 is at one end of a support arm mounted in a cantilever fashion such that the entire substrate support/support arm assembly can be removed from the reactor by passing the assembly through an opening in the sidewall of the reactor. The substrate support 118 can include a chucking apparatus such as an electrostatic chuck 120 and the substrate can be surrounded by a dielectric focus ring 122. The chuck can include an RF biasing electrode for applying an RF bias to the substrate during an etching process. The etching gas supplied by gas supply 106 can flow through channels between the window 110 and an underlying gas distribution plate 124 and enter the interior 102 through gas outlets in the plate 124. The reactor can also include a heated liner 126 extending conically from the plate 124.

Figure 7:
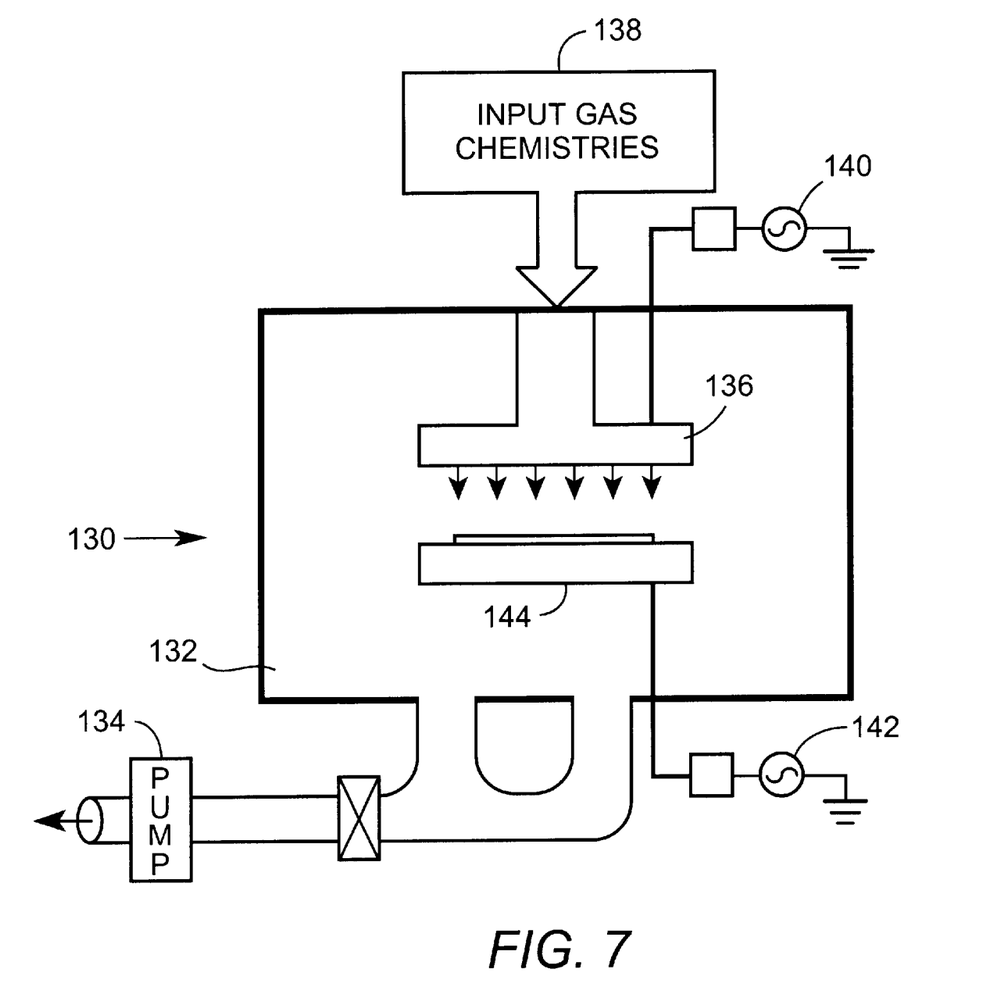
FIG. 7 shows a schematic representation of a medium density parallel plate plasma reactor which can be used to carry out the process of the invention.

The process of the invention can also be carried out in a parallel plate plasma reactor such as reactor 130 shown in FIG. 7. The reactor 130 includes an interior 132 maintained at a desired vacuum pressure by a vacuum pump 134 connected to an outlet in a wall of the reactor. Etching gas can be supplied to a showerhead electrode 136 by supplying gas from gas supply 138. A medium density plasma can be generated in the reactor by supplying RF energy from RF sources 140,142 to the showerhead electrode 136 and a bottom electrode 144 or the showerhead electrode 136 can be electrically grounded and RF energy at two different frequencies can be supplied to the bottom electrode 144.

In one embodiment, the invention provides a process for plasma etching ARC layers prior to etching high aspect ratio features such as conductor lines, vias and contacts including damascene structures and self aligned contacts (SAC) in dielectric layers on semiconductor substrates. In the process, a fluorine-free gas mixture containing a carbon-containing gas, a nitrogen-containing gas, an optional oxygen-containing gas and optional inert gas such as argon is energized in a plasma etch reactor into a plasma state such that the carbon and oxygen reactants are at least partially dissociated. During the etching process, the ARC layer is etched by the oxygen and carbon deposited on surfaces of the etched features reduces the lateral etch rate of the photoresist, masking and/or stop etch layers. The combination of carbon and oxygen is effective in providing a desired level of selectivity between the etch rates of the ARC layer being etched and an underlying layer such as silicon oxide or silicon nitride and/or an overlayer such as a photoresist while at the same time balancing polymer build-up sufficiently to protect sidewalls of etched features while avoiding etch stop problems due to excessive polymer build-up. In the process of the invention, the polymer build-up can be reduced by the synergistic effect of breaking up the polymer with the oxygen in the etching gas mixture. Further, in order to preserve the critical dimension (CD) of the etched feature, the oxygen removes enough of the polymer build-up on the sidewalls of the etched openings to avoid excessive build-up of polymer on the sidewalls which otherwise prevent etching of the opening with the desired uniformity.

According to the invention, carbon-containing gas and oxygen-containing gas is preferably supplied to the plasma etching reactor in amounts effective to preferentially etch the ARC layer while suppressing the lateral etch rate of the overlying and/or underlying layers.

The carbon-containing gas preferably comprises CO and the oxygen-containing-gas preferably comprises $O_2$. The etching gas mixture also contains nitrogen and may optionally include other gases and/or an inert carrier gas. In order to maintain low pressure in the plasma etching reactor, the amount of carrier gas introduced into the reactor can be at low flow rates. For instance, for a medium to high density plasma reactor, argon can be supplied into the reactor in amounts of 50 to 500 sccm. The carrier gas preferably aids striking and/or sustaining of the plasma and may aid the ARC etch rate, e.g., the ARC etching rate can be increased due to sputtering of the ARC.

The CO and $O_2$ reactants can each be supplied at flow rates of 20 to 350 sccm CO and 2 to 30 sccm $O_2$, $N_2$ can be supplied to the plasma etch reactor at a flow rate of 0 to 250 sccm, preferably 20 to 200 sccm. The advantageous effects of the invention can be achieved by supplying the carbon reactant and oxygen reactant to the plasma etching reactor at a flow rate ratio of 10 or more times the amount of carbon reactant to oxygen reactant, e.g, $CO:O_2$ flow rates of 10:1 to 100:1, preferably 15:1 to 50:1. As an example, the CO flow rate can range from 100 to 200 sccm when $O_2$ is supplied at 4 to 6 sccm, and nitrogen can be supplied at 50 to 150 sccm and argon, if supplied, can range from 100 to 300 sccm. In another example, the CO and $O_2$ are supplied to the plasma etch reactor at flow rates to selectively etch an ARC layer and to minimize lateral etch rates of an overlying photoresist layer in a dual damascene or SAC structure.

It will be apparent to those skilled in the art that the flow rates of the various gases will depend on factors such as the size of the substrate, the type of plasma reactor, the power settings, the vacuum pressure in the reactor, the dissociation rate for the plasma source, etc.

The process of the invention is useful for obtaining extremely high selectivity to oxide during an ARC etch process, the process being especially useful for obtaining openings smaller than 0.3 $\mu$m, preferably as small as 0.18 $\mu$m and below. For example, in one embodiment, a dual frequency capacitively coupled plasma etch reactor was operated with a top electrode power of 50–3000 W, preferably 300–1000 W, and a bottom electrode power of 20–3000 W, preferably 200–500 W, to achieve the desired etch selectivity ratio.

The reactor pressure is preferably maintained at a level suitable for sustaining a plasma in the reactor. In general, too low a reactor pressure can lead to plasma extinguishment whereas in a high density etch reactor too high a reactor pressure can lead to the etch stop problem. For high density plasma reactors, the reactor is preferably at a pressure below 30 mTorr, more preferably below 10 mTorr. For medium density plasma reactors, the reactor is preferably at a pressure from 30 to 200 mTorr, more preferably from 50 to 200 mTorr. Due to plasma confinement at the semiconductor substrate undergoing etching, the vacuum pressure at the substrate surface may be higher than the vacuum pressure setting for the reactor.

The substrate support supporting the semiconductor substrate undergoing etching preferably cools the substrate enough to prevent deleterious side reactions such as burning of any photoresist on the substrate and formation of undesirable reactant gas radicals. In high and medium density plasma reactors, it is sufficient to cool the substrate support to a temperature of –20 to +200° C., preferably –10° C. to +50° C. The substrate support can include a bottom electrode for supplying an RF bias to the substrate during processing thereof and an ESC for clamping the substrate. For example, the substrate can comprise a silicon wafer which is electrostatically clamped and cooled by supplying helium (He) at a desired pressure between the wafer and top surface of the ESC. In order to maintain the wafer at a desired temperature of the He can be maintained at a pressure of 2 to 30 Torr in the space between the wafer and the chuck.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of etching an organic anti-reflective coating (ARC) with selectivity to an overlying photoresist and/or an underlying dielectric layer, comprising:
   supporting a semiconductor substrate in a plasma etch reactor, the substrate including a patterned photoresist over an organic anti-reflective coating (ARC) and/or a dielectric layer underlying the ARC;
   energizing a fluorine-free etchant gas into a plasma state and etching openings in the ARC, the etchant gas comprising a carbon-containing gas, a nitrogen-containing gas, an oxygen-containing gas different from the carbon-containing gas and an optional inert carrier gas.

2. The method of claim 1, wherein the openings comprise vias, contacts, and/or trenches of a dual damascene or self-aligned structure.

3. The method of claim 1, wherein the dielectric layer comprises a doped or undoped silicon oxide and the ARC comprises a polymer layer.

4. The method of claim 1, wherein the plasma etch reactor comprises an ECR plasma reactor, an inductively coupled plasma reactor, a capacitively coupled plasma reactor, a helicon plasma reactor or a magnetron plasma reactor.

5. The method of claim 1, wherein the plasma etch reactor comprises a dual frequency capacitively coupled plasma reactor including an upper showerhead electrode and a bottom electrode, RF energy being supplied at two different frequencies to either the bottom electrode or at different first and second frequencies to the showerhead electrode and bottom electrode.

6. The method of claim 1, wherein the etchant gas includes the inert carrier gas, the carbon-containing gas is CO, the oxygen-containing gas is $O_2$, the nitrogen-containing gas is $N_2$ and the inert carrier gas is Ar.

7. The method of claim 6, wherein the CO dissociates such that dissociated oxygen etches the ARC and dissociated carbon minimizes lateral etching of the photoresist.

8. The method of claim 6, wherein the $N_2$ is supplied to the plasma etch reactor at a flow rate sufficient to provide stability to the plasma and preserve critical dimensions of the etched openings.

9. The method of claim 1, wherein the pressure in the plasma etch reactor is 50 to 200 mTorr and/or temperature of the substrate support is –20° C. to +200° C.

10. The method of claim 1, wherein the plasma etch reactor is a capacitively coupled plasma reactor having a powered showerhead electrode and/or a powered bottom electrode, the showerhead electrode being supplied 0 to 3000 W of RF energy and the bottom electrode being supplied 0 to 3000 W of RF energy.

11. The method of claim 1, wherein the carbon-containing gas comprises CO supplied to the plasma etch reactor at a rate of at least 40 sccm CO.

12. The method of claim 1, wherein the ARC has a non-uniform pre-etch thickness with a first thickness at a first portion of the etched openings and a second thickness at a second portion of the etched openings, the first thickness being at least 25% thicker than the second thickness.

13. The method of claim 1, wherein the ARC has a first pre-etch thickness at corners of vias in the dielectric layer and a second pre-etch thickness at corners of trenches in a patterned photoresist overlying the ARC and dielectric layers, the first pre-etch thickness being thinner than the second pre-etch thickness.

14. The method of claim 1, wherein an etch rate selectivity of the etch rate of the dielectric layer to the etch rate of the ARC layer is at least 10.

15. The method of claim 14, wherein the etch rate of the dielectric layer is substantially zero.

16. The method of claim 1, wherein the etchant gas includes CO and $O_2$ supplied to the plasma etch reactor at a flow rate ratio of $CO:O_2$ of 10:1 to 100:1.

17. The method of claim 1, wherein the etchant gas including CO and $O_2$ supplied to the plasma etch reactor at a flow rate ratio of $CO:O_2$ of 15:1 to 50:1.

18. The method of claim 1, wherein the etchant gas is Ar-free and/or hydrogen-free.

19. The method of claim 1, wherein the etchant gas includes CO and $N_2$, the $CO:N_2$ flow rate ratio being 7:1 to 1:7.

20. The method of claim 1, wherein the etchant gas includes CO and $N_2$, the $CO:N_2$ flow rate ratio being 4:1 to 1:2.

* * * * *